(12) United States Patent
Kim et al.

(10) Patent No.: US 7,701,833 B2
(45) Date of Patent: Apr. 20, 2010

(54) AUTOMATIC GAIN CONTROLLERS AND METHODS FOR CONTROLLING VOLTAGE OF CONTROL GAIN AMPLIFIERS

(75) Inventors: Je-kook Kim, Yongin-si (KR); Jun-ho Huh, Yongin-si (KR); Sang-hoon Moon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 904 days.

(21) Appl. No.: 11/492,766

(22) Filed: Jul. 26, 2006

(65) Prior Publication Data

US 2007/0026829 A1 Feb. 1, 2007

(30) Foreign Application Priority Data

Jul. 27, 2005 (KR) ...................... 10-2005-0068538

(51) Int. Cl.
*G11B 7/00* (2006.01)
(52) U.S. Cl. ..................... 369/124.11; 360/67
(58) Field of Classification Search ........................ None
See application file for complete search history.

(56) References Cited

U.S. PATENT DOCUMENTS

| | | | | |
|---|---|---|---|---|
| 4,434,439 A | * | 2/1984 | Steckler et al. | 348/572 |
| 4,476,901 A | * | 10/1984 | Sainen | 139/370.2 |
| 5,784,356 A | * | 7/1998 | Hayashi et al. | 369/47.25 |
| 6,297,627 B1 | | 10/2001 | Towne et al. | |
| 2005/0201253 A1 | * | 9/2005 | Yang et al. | 369/124.1 |

FOREIGN PATENT DOCUMENTS

| | | |
|---|---|---|
| EP | 0 453 223 | 10/1991 |
| JP | 09-148862 | 6/1997 |
| JP | 10-341337 | 12/1998 |
| JP | 2003-309785 | 10/2003 |
| KR | P1999-0051851 | 7/1999 |
| KR | 1020060049798 | 5/2006 |

OTHER PUBLICATIONS

Preliminary Notice of the First Office Action from the Taiwanese Patent Office dated Nov. 12, 2009.

* cited by examiner

*Primary Examiner*—Peter Vincent Agustin
*Assistant Examiner*—Jesse Hauck
(74) *Attorney, Agent, or Firm*—Harness, Dickey & Pierce, P.L.C.

(57) ABSTRACT

An automatic gain controller includes a voltage control gain amplifier amplifying input signals in response to a control voltage and producing output signals. A level detector detects peak and bottom levels of the output signals of the voltage control gain amplifier, and an analog-digital converter (ADC) converts the detected peak and bottom levels into digital signals. A peak detector detects a digital peak in response to a difference between the digital peak level and digital bottom level, and a voltage controller compares the digital peak and a reference voltage, and controls the control voltage.

29 Claims, 3 Drawing Sheets

AUTOMATIC GAIN CONTROLLERS AND METHODS FOR CONTROLLING VOLTAGE OF CONTROL GAIN AMPLIFIERS

PRIORITY STATEMENT

This non-provisional U.S. patent application claims priority under 35 U.S.C. § 119 to Korean Patent Application No. 10-2005-0068538, filed on Jul. 27, 2005, in the Korean Intellectual Property Office (KIPO), the entire contents of which is incorporated herein by reference.

BACKGROUND

Related art optical disk recording reproducers reproduce data recorded on optical disks such as compact disks (CD), digital versatile disks (DVD), etc. Related art reproducers do so by restoring radio frequency (RF) signals from the optical disks. For example, optical disk recording reproducers irradiate light onto optical disks, detect reflected light using photo diodes (PD), generate RF signals using the detected light, and slice generated RF signals into a constant level to restore data.

RF signals may have different amplitudes according to; for example, a difference in reflectivity between disks, a difference in reflectivity between inner and outer circumferences of disks, a change in inclinations of laser diodes, etc. To accurately restore data, RF signals must be sliced relatively accurately, and maintain a constant amplitude. Related art optical disk recording reproducers include automatic gain controllers for assisting in more accurately restoring data.

Automatic gain controllers feed back outputs of optical disk recording reproducers and control gain so that output signals maintain a constant amplitude. A related art redundant automatic gain controller will now be described with reference to FIG. 1.

FIG. 1 is a block diagram of a related art automatic gain controller 100. Referring to FIG. 1, RF signals detected by an optical pickup (not shown) are input to the automatic gain controller 100. The input RF signals are differential signals AGCIP and AGCIN having opposite phases and which have varying amplitudes.

The automatic gain controller 100 controls gain in response to a control voltage VCTRL. For example, the input RF signals AGCIP and AGCIN are amplified by a variable gain amplifier (VGA) 111, and an automatic gain control (AGC) output unit 113 produces output RF signals AGCOP and AGCON The automatic gain controller 100 may further include an equalizer EQ 115 and a slicer (not shown). The equalizer EQ 115 equalizes the output RF signals AGCOP and AGCON. The slicer slices the equalized output RF signals EQOP and EQON to a desired level. The sliced output RF signals AGCOP and AGCON are converted into digital signals, to restore data.

The gain of the automatic gain controller 110 is controlled in response to control voltage VCTRL as mentioned above. An example operation of controlling the control voltage VCTRL using the automatic gain controller 100 will be described below.

The control voltage VCTRL may be controlled by feeding back the output RF signals AGCOP and AGCON whose amplitude is controlled by the automatic gain controller 100 or by feeding back the equalized output RF signals EQOP and EQON. An example operation of controlling the control voltage VCTRL using equalized signal feedback will be described below.

The equalized output RF signals EQOP and EQON are filtered by a high pass filter (HPF) 121 and the filtered RF signals EQOP and EQON are output to a comparator 123 and a level detector 125. The comparator 123 compares the filtered RF signals EQOP and EQON and outputs a comparison signal CMP. The comparison signal CMP is used to control a response time of the automatic gain controller 100.

The level detector 125 detects peak and bottom levels of the filtered RF signals EQOP and EQON and outputs a voltage level signal LVLO. Each of the comparison signal CMP and the voltage level signal LVLO are output to a voltage controller 127. The voltage controller 127 detects a difference between the voltage level signal LVLO and a reference voltage and controls the control voltage VCTRL based on the difference.

For example, the voltage controller 127 may include a charge pump (not shown). The charge pump supplies charges to external capacitors CAGCID, CAGCUD or CAGROM according to the difference in voltage. The control voltage VCTRL is controlled based on voltages stored in the external capacitors CAGCID, CAGCUD or CAGROM. The automatic gain controller 100 uses the control voltage VCTRL to control the gain, and the MUX 131 selects one of the capacitors CAGCID, CAGCUD and CAGROM based on types of disk. For example, in case that RAM disk is used, MUX 131 selects capacitor CAGCID in response to RAM disk indication signal RAM and header signal HD. The external capacitors CAGCID, CAGCUD and CAGROM may be classified into types of disks. Charges supplied from the charge pump are stored in different external capacitors CAGCID, CAGCUD or CAGROM according to the type of disk.

The voltage controller 127 controls a current input to the charge pump in response to the comparison signal CMP, thereby controlling a setting time of the automatic gain controller 100. When a fingerprint and/or scratch exists on the disk of the voltage controller 127, a hold signal HOLD may hold or temporarily stop controlling an automatic gain in response to header signal HD and control signal VFO determined in response to the types of disks. When data is recorded on disks, the fixed voltage generator 129 outputs a fixed voltage using a fixed gain signal FIXG, and the voltage controller 127 outputs the fix signal. The fixed voltage may be transmitted in response to the fix signal FIX.

However, because the automatic gain controller 100 has a complex analogue control circuit for generating the control voltage VCTRL, it may be more difficult to implement the automatic gain controller 100 on a system on chip (SOC).

For example, the automatic gain controller 100 requires a separate block for controlling a response time according to a disk speed and separate external capacitors CAGCID, CAGCUD, and CAGROM for storing charges supplied from the charge pump. This increases the required number of pins corresponding to the external capacitors CAGCID, CAGCUD and CAGROM.

The automatic gain controller 100 further includes a separate reference voltage generator comprising a digital-analogue converter for generating a reference voltage and a separate fixed voltage generator 129 for acquiring a fixed gain.

The automatic gain controller 100 also requires many control signals for controlling an analogue circuit resulting in a more complex circuit layout and the charge pump and capacitors have a fixed capacitance, which slows a response in emergency. In addition, characteristic distribution between devices is relatively wide.

SUMMARY

Example embodiments of the present invention relate to automatic gain controllers and methods of controlling a control voltage. At least one example embodiment of the present invention relates to an automatic gain controller that may digitalize peak and bottom labels of an output of an automatic gain amplifier and/or digitally control a control voltage of a voltage control gain amplifier. At least one other example embodiment of the present invention relates to a method of digitally controlling the control voltage of the voltage control gain amplifier.

Example embodiments of the present invention provides an automatic gain controller that digitizes peak and bottom levels of an output of an automatic gain amplifier and digitally controls a control voltage of a voltage control gain amplifier.

Example embodiments of the present invention also provide methods for digitalizing peak and bottom levels of an output of an automatic gain amplifier and digitally controlling a control voltage of a voltage control gain amplifier.

According to an example embodiment of the present invention, an automatic gain controller may comprise a voltage control gain amplifier for amplifying input signals based on a control voltage and outputting amplified signals. A level detector may detect peak and bottom levels of the amplified signals. An analog-to-digital converter (ADC) may convert the detected peak and bottom levels into digital signals and a peak detector may detect a digital peak of the output signal in response to a difference between the digital peak level and the digital bottom level. A voltage controller may compare the digital peak and a reference voltage to control the control voltage.

According to another example embodiment of the present invention, a method for controlling a control voltage may include detecting peak and bottom levels of a plurality of output signals. The output signals may be input signals amplified based on a control voltage. The detected peak and bottom levels may be converted into digital signals, and a digital peak of the output signals may be detected in response to a difference between the digital peak level and the digital bottom level. The digital peak and a reference voltage may be compared to control the control voltage.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS

Figure 1:
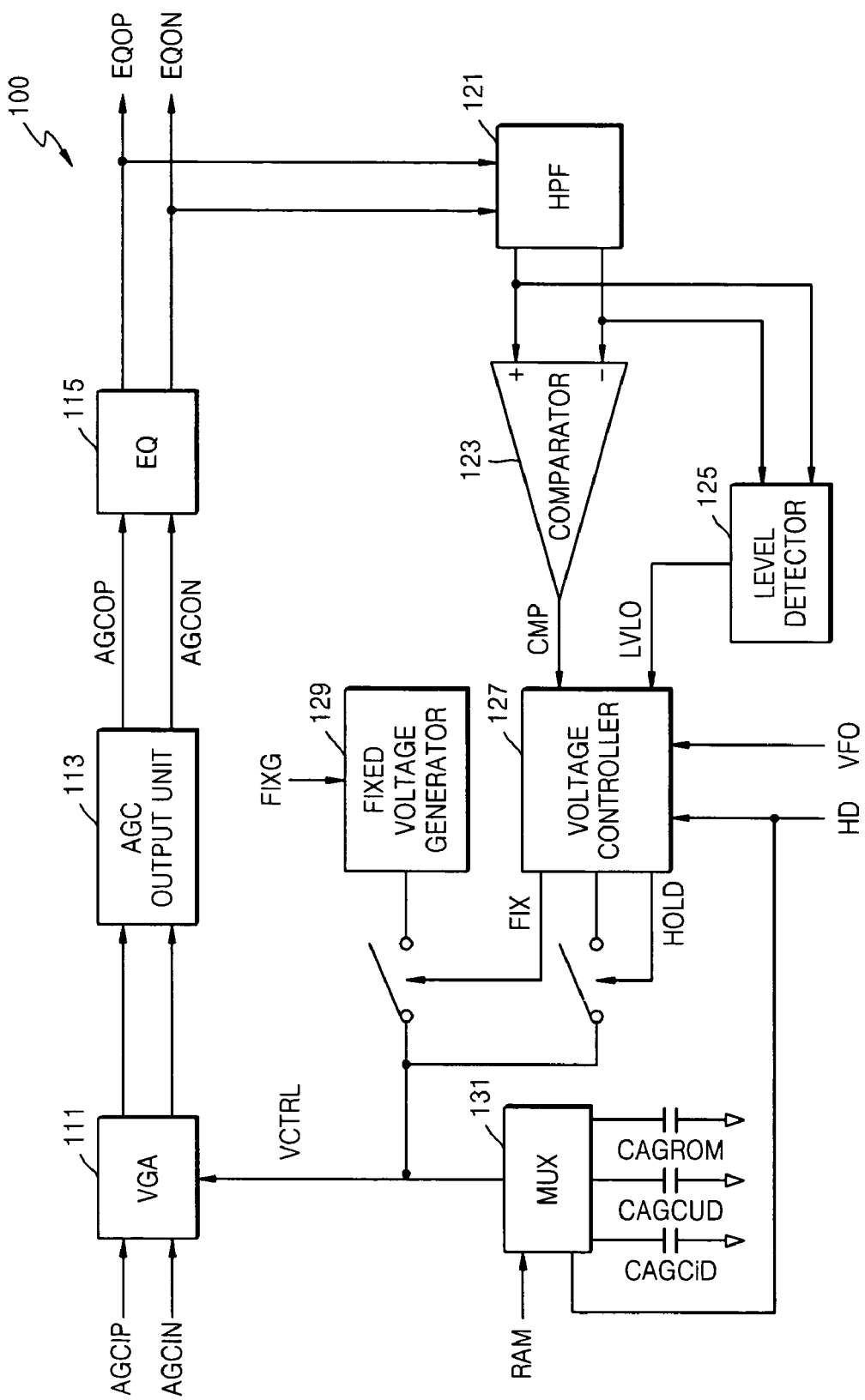
FIG. 1 is a block diagram of a related art automatic gain controller.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
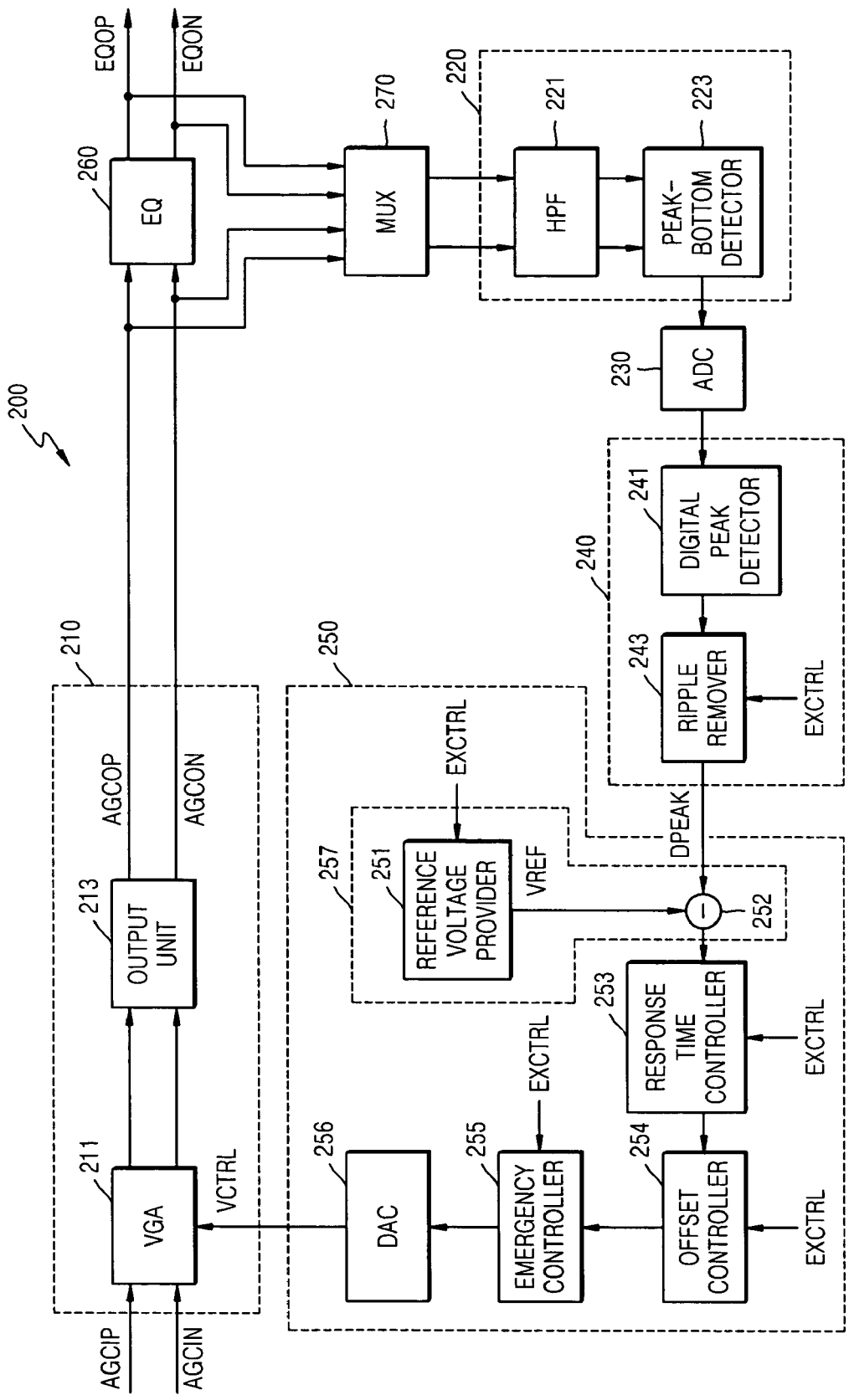
FIG. 2 is a block diagram of an automatic gain controller, according to an example embodiment of the present invention.

FIG. 2 is a block diagram of an automatic gain controller according to an example embodiment of the present invention. Referring to FIG. 2, an automatic gain controller 200 may comprise a voltage control gain amplifier 210, a level detector 220, an analog-to-digital converter (ADC) 230, a peak detector 240, a voltage controller 250, an equalizer (EQ) 260 and/or a multiplexer (MUX) 270. Although the automatic gain controller 200 of FIG. 2 is shown as including all of the above described components, it will be understood that an automatic gain controller, according to example embodiments, may include only a portion of these components as will be discussed in more detail below. In at least one example embodiment, the equalizer 260 and the multiplexer 270 may be omitted from the automatic gain controller.

An example operation of controlling a control voltage VCTRL using the output signals AGCOP and AGCON from the voltage control gain amplifier 210 in the automatic gain controller 200 will now be described. In other words, an example operation of the automatic gain controller 200 without the equalizer 260 and the multiplexer 270 will be described. However, the operation of the automatic gain controller 200 including the equalizer 260 and the multiplexer 270 may be similar or substantially similar, except that the multiplexer 270 may select one of output signals AGCOP and AGCON and equalized signals EQOP and EQON. The signals selected by the multiplexer 270 may be output to the level detector 220. In yet another example embodiment, the multiplexer 270 may select one of output signals AGCOP and AGCON and one of output signals EQOP and EQON.

Referring still to FIG. 2, the voltage control gain amplifier 210 may amplify input signals AGCIP and AGCIN based on the control voltage VCTRL to produce the output signals AGCOP and AGCON. The level detector 220 may detect peak and bottom levels of the output signals AGCOP and AGCON from the voltage control gain amplifier 210. As discussed above, the output signals AGCOP and AGCON may be selected by the multiplexer 270.

The level detector 220 may comprise a high pass filter (HPF) 221 and a peak-bottom detector 223. The HPF 221 may filter out lower frequency components of the output signals AGCOP and AGCON. The peak-bottom detector 223 may detect peak and bottom levels of the filtered output signals AGCOP and AGCON.

The ADC 230 may digitize the detected peak and bottom levels into digital signals. The peak detector 240 may detect a digital peak DPEAK based on a difference between the digital peak level and the digital bottom level. The peak detector 240 may include a digital peak detector 241 and/or a ripple remover 243. The digital peak detector 241 may low-pass-filter (e.g., attenuates higher frequency components, while passing lower frequency components) the difference between the digital peak level and the digital bottom level to generate the digital peak DPEAK. The ripple remover 243 may remove a ripple in the digital peak DPEAK. An example embodiment of the digital peak detector 241 will now be described with reference to FIG. 3.

Figure 3:
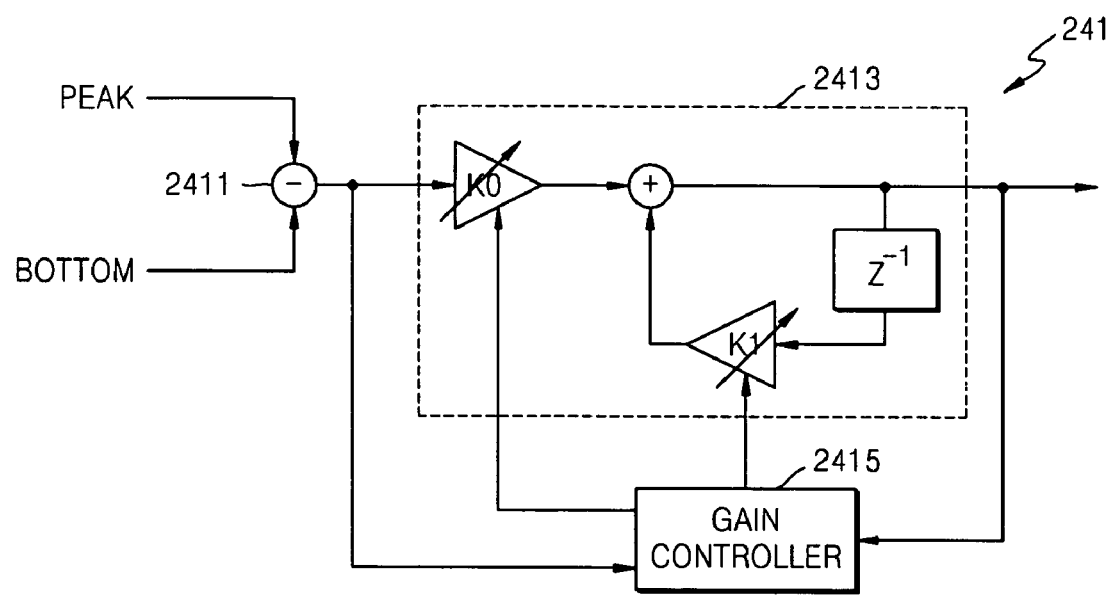
FIG. 3 is a block diagram of a digital peak detector according to an example embodiment of the present invention.

FIG. 3 is a block diagram of a digital peak detector, according to an example embodiment of the present invention. The digital peak detector of FIG. 3 may be used as the digital peak detector 241 of FIG. 2.

Referring to FIG. 3, the digital peak detector 241 may include a level subtractor 2411, a peak detection low-pass filter 2413 and/or a gain controller 2415. The level subtractor 2411 may subtract the digital bottom level BOTTOM from the digital peak level PEAK to obtain a peak value. The peak detection low-pass filter 2413 may low-pass-filter the peak value output by the level subtractor 2411 and output a digital peak envelope (e.g., the digital peak DPEAK).

The gain controller 2415 may compare signals input to the peak detection low-pass filter 2413 with signals output from the peak detection low-pass filter 2413 to control the gain or gains of the peak detection low-pass filter 2413. A method of controlling gains of the peak detection low-pass filter 2413 in the gain controller 2415 will be described in more detail below.

The gain controller 2415 may compare a signal input to the peak detection low-pass filter 2413 by the level subtractor 2411, with a signal output by the peak detection low-pass filter 2413 to control gains K0 and K1 of the peak detection low-pass filter 2413. In one example, if the signal output by the peak detection low-pass filter 2413 is greater than or equal to the signal input to the peak detection low-pass filter 2413, the gain controller 2415 may control the gains K0 and K1 such that a peak of the peak detection low-pass filter 2413 has a higher frequency. For example, the gain controller 2415 may control the gains K0 and K1 such that a pole of the peak detection low-pass filter has a higher or high frequency.

In another example, if the signal input to the peak detection low-pass filter 2413 is greater than the signal output by the peak detection low-pass filter 2413, the gain controller 2415 may control the gains K0 and K1 such that the peak of the peak detection low-pass filter 2413 has a lower frequency. For example, the gain controller 2415 may control the gains K0 and K1 such that pole of the peak detection low-pass filter has a lower or low frequency.

Returning to FIG. 2, the ripple remover 243 may low-pass-filter the digital peak DPEAK output from the digital peak detector 241 to remove a ripple or ripples included in the digital peak DPEAK. In at least one example embodiment, the ripple remover 243 may be a low-pass filter, for example, a first low-pass filter.

Referring still to FIG. 2, the voltage controller 250 may compare the digital peak DPEAK and a reference voltage VREF to control the control voltage VCTRL. The voltage controller 250 may include a comparator 257, a response time controller 253, an offset controller 254, an emergency controller 255 and/or a digital-to-analog converter (DAC) 256. The comparator 257 may compare the digital peak DPEAK with the reference voltage VREF and output a digital control voltage. In at least one example embodiment, the comparator 257 may include a reference voltage provider 251 and a subtractor 252. The reference voltage provider 251 may generate the reference voltage VREF based on an external control signal EXCTRL. The external control signal EXCTRL may identify or indicate a type of optical disk. For example, if an optical disk is mounted, a processor (not shown) included in an optical disk recording reproducer (not shown) may determine the type of the optical disk, and generate an external control signal EXCTRL. The external control signal EXCTRL may be used to determine the reference voltage VREF.

The reference voltage provider 251 may generate the reference voltage VREF based on the type of optical disk and/or in response to the external control signal EXCTRL. In at least this example embodiment of the present invention, the reference voltage provider 251 may be a register storing the reference voltage VREF. The subtractor 252 may output a difference between the digital peak DPEAK and the reference voltage VREF as the digital control voltage and the control voltage VCTRL may be controlled in response to the digital control voltage.

The DAC 256 may convert the digital control voltage into the control voltage VCTRL. For example, the DAC 256 may convert the digital control voltage into an analog control voltage VCTRL.

For example, the processor may output a signal (e.g., the external control signal EXCTRL) for controlling a response time and/or offset of the control voltage VCTRL based on the type of optical disk.

The response time controller 253 may control the response time of the control voltage VCTRL output from the comparator 257. The response time controller 253 may control the response time of the control voltage VCTRL based on the type of optical disk. The response time controller 253 may determine the type of optical disk based on an external control signal EXCTRL. In at least one example embodiment of the present invention, the response time controller 253 may be a low-pass filter that controls gains based on the type of optical disk.

Figure 4:
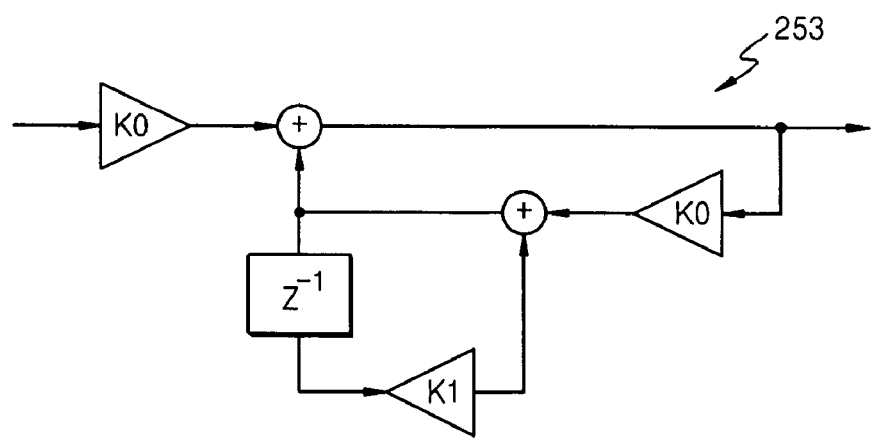
FIG. 4 is a block diagram of a response time controller according to an example embodiment of the present invention.

FIG. 4 is a block diagram of a response time controller, according to an example embodiment of the present invention. Referring to FIG. 4, unlike a related art low-pass filter, the response time controller 253 may provide gains to a feedback signal added to an amplified input signal to increase gains at lower frequencies.

Returning to FIG. 2, the offset controller 254 may also receive the external control signal EXCTRL, and the offset controller 254 may control an offset of the control voltage VCTRL based on the type of optical disk indicated external control voltage EXCTRL. In at least one example embodiment, the offset controller 254 may include an offset storage (not shown) and/or an adder (not shown). The offset storage may store an offset according to the type of disk and in response to the external control signal EXCTRL. The adder may control the offset of the digital control voltage by adding the offset stored in the offset storage and the digital control voltage.

Still referring to FIG. 2, the emergency controller 255 may also receive the external control signal EXCTRL, and may control the control voltage VCTRL when the external control signal EXCTRL indicates an emergency operation. In at least one example embodiment, the emergency controller 255 may output the digital control voltage when the external control signal EXCTRL indicates a normal operation, and a digital voltage having a fixed value when the external control signal EXCTRL indicates an emergency operation. An emergency operation may be, for example, a hold operation in which an optical disk recording reproducer is shocked or, automatic gain control is improperly performed (e.g., due to a fingerprint and/or a scratch on the optical disk), a write operation in which the optical disk is written, etc.

The emergency controller 255 may output an updated digital control voltage (e.g., during normal operation), a previously output digital control voltage as a fixed digital voltage (e.g., during a hold operation) or the fixed digital voltage (e.g., during a write operation) in response to the external control signal EXCTRL. The external control signal EXCTRL may indicate an emergency operation or normal operation.

In at least one example embodiment, the emergency controller 255 may include a fixed voltage provider (not shown) and/or a multiplexer (not shown). The fixed voltage provider may provide the fixed digital voltage in response to the external control signal EXCTRL. The multiplexer may output the fixed digital voltage or the digital control voltage in response to the external control signal EXCTRL. The fixed voltage provider may be a register storing previously output digital control voltage or voltages as the fixed digital voltage when the external control signal EXCTRL indicates a hold operation and storing a fixed digital voltage or voltages for the write operation when the external control signal EXCTRL indicates a write operation.

As discussed above, in another example embodiment, the automatic gain controller 200 may include an equalizer 260 and a multiplexer 270. The equalizer 260 may equalize output signals AGCON and AGCOP to produce equalized signals EQON and EQOP, respectively. The multiplexer 270 may select output signals AGCON and AGCOP, equalized signals EQON and EQOP or a combination thereof.

This example embodiment will be described assuming the equalized signals EQON and EQOP are selected by the multiplexer 270. However, if a combination of output signals AGCON and AGCOP and equalized signals EQON and EQOP are selected, the automatic gain controller may operate in the same or substantially the same manner.

The equalized signals EQON and EQOP may compensate for amplitude variations according to length and/or depth of an optical disk.

The signals selected by the multiplexer 270 may be output to the level detector 220. The control voltage VCTRL may be controlled using the output signals of the multiplexer 270 in the same or substantially the same manner as described above with regard to FIG. 2. Therefore, a detailed description of this example operation has been omitted for the sake of brevity.

The automatic gain controller 200 may use a digital circuit for controlling the control voltage VCTRL regardless of resistance and/or capacitors. The automatic gain controller 200 may more easily and/or digitally control the control voltage VCTRL to change characteristics of a circuit using the external control signal EXCTRL according to a type of optical disk. For example, the automatic gain controller 200 may more easily control a response time, offset and/or emergency operation of the control voltage VCTRL by changing the external control signal EXCTRL according to a type of optical disk.

Automatic gain controllers, according to example embodiments, may have a smaller chip size, reduced power consumption, constant or substantially constant quality and/or increased production rate.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. An automatic gain controller comprising:
    a voltage control gain amplifier amplifying input signals based on a control voltage to generate a plurality of signals;
    a level detector detecting peak and bottom levels of the plurality of signals;
    an analog-to-digital converter converting the detected peak and bottom levels into digital signals;
    a peak detector detecting a digital peak of the output signal from the analog-to-digital converter based on a difference between the digital peak level and the digital bottom level; and
    a voltage controller comparing the digital peak and a reference voltage to control the control voltage.

2. The automatic gain controller of claim 1, wherein the level detector includes,
    a high pass filter for filtering out low frequency components of the plurality of signals, and
    a peak-bottom detector detecting peak and bottom levels of the filtered signals.

3. The automatic gain controller of claim 1, wherein the peak detector includes,
    a digital peak detector for filtering the difference between the digital peak level and the digital bottom level to detect the digital peak, and
    a ripple remover for removing a ripple from an output of the digital peak detector.

4. The automatic gain controller of claim 3, wherein the digital peak detector further includes,
   a level subtractor subtracting the digital bottom level from the digital peak level to obtain a peak value,
   a peak detection low-pass filter filtering the peak value output by the level subtractor to output the digital peak, and
   a gain controller comparing input and output signals of the peak detection low-pass filter to control gains of the peak detection low-pass filter.

5. The automatic gain controller of claim 4, wherein, if the output signal of the peak detection low-pass filter is greater than the input signal of the peak detection low-pass filter, the automatic gain controller controls the gain of the peak detection low-pass filter so that a pole of the peak detection low-pass filter has a high frequency, and
   if the input signal of the peak detection low-pass filter is greater than the output signal of the peak detection low-pass filter, the automatic gain controller controls the gains of the peak detection low-pass filter so that the pole of the peak detection low-pass filter has a low frequency.

6. The automatic gain controller of claim 3, wherein the ripple remover is a low-pass filter.

7. The automatic gain controller of claim 1, wherein the voltage controller includes,
   a comparator comparing the digital peak and the reference voltage to output a digital control voltage, and
   a digital-analog converter (DAC) converting the digital control voltage into the control voltage.

8. The automatic gain controller of claim 7, wherein the comparator includes,
   a reference voltage provider generating the reference voltage, and
   a subtractor outputting a difference between the digital peak and the reference voltage.

9. The automatic gain controller of claim 8, wherein the reference voltage is determined based on an external control signal indicating a type of optical disk and the reference voltage provider is a register storing the determined reference voltage.

10. The automatic gain controller of claim 7, wherein the voltage controller further includes,
    a response time controller controlling a response time of the control voltage based on an external control signal indicating the type of optical disk.

11. The automatic gain controller of claim 10, wherein the response time controller is a low-pass filter controlling gains based on the external control signal indicating the type of optical disk.

12. The automatic gain controller of claim 7, wherein the voltage controller further includes,
    an offset controller that controls an offset of the digital control voltage based on an external control signal indicating the type of the optical disk.

13. The automatic gain controller of claim 12, wherein the offset controller includes,
    an offset storage storing an offset based on the external control signal indicating the type of optical disk, and
    an adder controlling an offset of the digital control voltage by adding the offset stored in the offset storage and the digital control voltage.

14. The automatic gain controller of claim 7, wherein the voltage controller further includes,
    an emergency controller that outputs the digital control voltage when the external control signal indicates a normal operation, and a fixed digital voltage when the external control signal indicates an emergency operation.

15. The automatic gain controller of claim 14, wherein the emergency controller includes,
    a fixed voltage provider providing the fixed digital voltage in response to the external control signal, and
    a multiplexer outputting the fixed digital voltage or the digital control voltage in response to the external control signal.

16. The automatic gain controller of claim 14, wherein the fixed voltage provider is a register storing a previously output digital control voltage when the external control signal indicates a hold operation, and storing a fixed digital voltage for a write operation when the external control signal indicates the write operation.

17. The automatic gain controller of claim 1, further including,
    an equalizer equalizing the plurality of signals to generate a plurality of equalized signals for detection at the level detector.

18. A method for controlling a control voltage, the method comprising:
    detecting peak and bottom levels of a signal;
    converting the detected peak and bottom levels into digital signals;
    detecting a digital peak of the signal based on a difference between the converted digital peak level and converted digital bottom level; and
    comparing the digital peak and a reference voltage to control the control voltage.

19. The method of claim 18, wherein the signal is generated based on amplified input signals, the amplified input signals being amplified in accordance with a control voltage and the detecting of the peak and bottom levels of the signal includes,
    filtering the signal, and
    detecting peak and bottom levels of the filtered output.

20. The method of claim 19, further including,
    generating the signal based on input signals, the input signals being amplified in accordance with a control voltage and the amplified input signals being equalized to compensate for amplitude variations.

21. The method of claim 18, wherein the detecting of the digital peak includes,
    filtering the difference between the converted peak level and the converted bottom level to detect the digital peak, and
    removing a ripple of the digital peak.

22. The method of claim 21, wherein the detecting of the digital peak includes,
    subtracting the converted bottom level from the converted peak level to obtain a peak value, and
    filtering the peak value in response to a difference between the peak value and the digital peak.

23. The method of claim 21, wherein the ripple removing of the digital peak is performed by filtering the peak value.

24. The method of claim 18, wherein the controlling of the control voltage includes,
    comparing the digital peak and the reference voltage to output a digital control voltage, and
    converting the digital control voltage into the control voltage.

25. The method of claim 24, wherein the reference voltage is determined based on a type of optical disk indicated by an external control signal.

26. The method of claim 24, wherein the controlling of the control voltage further includes,
    controlling a response time of the control voltage according to the type of optical disk indicated by an external control signal.

27. The method of claim 24, wherein the controlling of the control voltage further includes, controlling an offset of the digital control voltage according to the type of optical disk indicated by an external control signal.

28. The method of claim 24, wherein the controlling of the control voltage further includes, outputting the digital control voltage when the external control signal indicates a normal operation or a fixed digital voltage when the external control signal indicates an emergency operation.

29. The method of claim 28, wherein a fixed voltage is a previously output digital control voltage when the external control signal indicates a hold operation, and the fixed voltage is a fixed digital write voltage when the external control signal indicates the write operation.

* * * * *